United States Patent [19]
Matsuura

[11] Patent Number: 5,985,769
[45] Date of Patent: *Nov. 16, 1999

[54] METHOD OF FORMING AN INTERLAYER INSULATING FILM

[75] Inventor: Masazumi Matsuura, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/601,658

[22] Filed: Feb. 14, 1996

[30] Foreign Application Priority Data

Aug. 7, 1995 [JP] Japan .................................. 7-201052

[51] Int. Cl.$^6$ .................................................. H01L 21/31
[52] U.S. Cl. ........................... 438/787; 438/672; 438/693; 438/791; 438/758
[58] Field of Search .................................. 438/787, 672, 438/693, 791, 903; 257/758

[56] References Cited

U.S. PATENT DOCUMENTS

| | | | |
|---|---|---|---|
| 3,652,331 | 3/1972 | Yamazaki | 117/201 |
| 5,614,733 | 3/1997 | Zhang et al. | 257/66 |
| 5,703,404 | 12/1997 | Matsuura | 257/758 |

FOREIGN PATENT DOCUMENTS

| | | | |
|---|---|---|---|
| 8-195439 | 1/1995 | Japan | 257/758 |
| WO 94/01885 | 1/1994 | WIPO . | |

OTHER PUBLICATIONS

"Novel Self Planarizing CVD Oxide for Interlayer Dielectric Applicatons," by M. Matsuura et al., *Technical Digest of IEDM* 1994.

"Planarisation for Sub–Micron Devices Utilising a New Chemistry," by A. Kiermasz et al., *Proceedings of DUMIC Conference* 1995.

Homma et al., "A Room Temperature Chemical Vapor Deposition SiOF Film Formation Technology for the Interlayer in Submicron Multilevel Interconnections", J. Electrochem. Soc., vol. 140, No.3, Mar. 1993, pp. 687–692.

Matsuura et al., "Novel Self–planarizing CVD Oxide for Interlayer Dielectric Applications", IEEE, 1994, pp. 117–120.

Kim et al., "Low Pressure Chemical Vapor Deposition of Silicon Dioxide Films by Thermal Decomposition of Tetra–alkoxysilanes", J. Electronchem. Soc., vol. 142, No. 2, Feb. 1995, pp. 676–682.

Tetsuya Homma et al., "A Room Temperature Chemical Vapor Deposition SiOF Film Formation Technology for the Interlayer in Submicron Multilevel Interconnections", J. Electrom. Soc., vol. 140, No. 3, Mar. 1993, pp. 687–692

*Primary Examiner*—Charles Bowers
*Assistant Examiner*—Reneé R. Berry
*Attorney, Agent, or Firm*—McDermott, Will & Emery

[57] ABSTRACT

A method of forming an uniform interlayer insulating film on a substrate of large size is provided. A semiconductor substrate is prepared which has an interconnection pattern formed thereon. A silicon oxide film is formed on the semiconductor substrate to cover the interconnection pattern by chemical vapor deposition method using mixed gas including gas having silicon atoms and hydrogen peroxide. A molar ratio of gas having silicon atoms to hydrogen peroxide is adjusted to be within the range of from 1:2 to 1:4.

15 Claims, 4 Drawing Sheets

+ : POINT FOR MEASUREMENT

MOLAR RATIO OF
HYDROGEN PEROXIDE / SILANE GAS

METHOD OF FORMING AN INTERLAYER INSULATING FILM

BACKGROUND OF THE INVENTION

1. Field of the Invention

The present invention generally relates to a method of forming an interlayer insulating film, and more particularly to an improved method thereof wherein the film can be formed uniformly on a substrate of large size.

2. Description of the Background Art

In a method of manufacturing a semiconductor device, a step of forming an interlayer insulating film is indispensable. FIGS. 5A–5C are cross sectional views of a semiconductor device in respective process steps of forming a conventional interlayer insulating film.

Referring to FIG. 5A, an aluminum interconnection pattern 12 is formed on a silicon substrate 11. A first plasma oxide film 13 is then deposited on the silicon substrate 11 such that it covers the surface of the aluminum interconnection pattern.

Referring to FIG. 5B, a silicon oxide film 14 (interlayer insulating film) is formed by chemical vapor deposition using mixed gas including silane gas ($SiH_4$) and hydrogen peroxide to cover the aluminum interconnection pattern.

Referring to FIG. 5C, a second plasma oxide film 15 is formed on the semiconductor substrate 11 to cover the silicon oxide film 14, thereby a planar insulating film is obtained.

The silicon oxide film 14 formed by CVD using silane gas and hydrogen peroxide can fill the space less than 0.25 μm between densely patterned interconnections. Further, the silicon oxide 14 is excellent in fluidity and therefore shows a self planarization feature, so that this method attracts attention as the next generation way for planarizing an interlayer insulating film alternative to the conventional way employing SOG (Spin on glass). (*Technical Digest of IEDM* 1994, *Proceedings of DUMIC Conference*, 1995)

A silicon oxide film has been formed as described above by CVD using silane gas and hydrogen peroxide. However, in the LSI process, as the diameter of a substrate wafer becomes larger, to deposit an uniform film over such a large wafer has become extremely difficult. Even if an interlayer insulating film is formed by CVD using silane gas and hydrogen peroxide as described, the CVD method still has the same problem. Although attempts have been made to improve the uniformity of film thickness by modifying the structure of a reaction chamber and adjusting the conditions of forming a film, an appropriate method has not been established.

SUMMARY OF THE INVENTION

Therefore, an object of the present invention is to provide a method of forming an interlayer insulating film which is improved to form an uniform interlayer insulating film by chemical vapor deposition method utilizing mixed gas including gas having silicon atoms and hydrogen peroxide.

Another object of the present invention is to form an interlayer insulating film of good quality by chemical vapor deposition method utilizing mixed gas including gas having silicon atoms and hydrogen peroxide.

Still another object of the invention is to achieve a higher rate of forming a film in a method of forming an interlayer insulating film by chemical vapor deposition method using mixed gas including gas having silicon atoms and hydrogen peroxide.

Yet another object of the invention is to form an interlayer insulating film by chemical vapor deposition method using mixed gas including gas having silicon atoms and hydrogen peroxide.

In the method of forming an interlayer insulating film according to the invention, a semiconductor substrate is prepared which has an interconnection pattern placed thereon. A silicon oxide film is deposited on the semiconductor substrate to cover the interconnection pattern by chemical vapor deposition using mixed gas including gas having silicon atoms and hydrogen peroxide. The silicon oxide film is formed with a molar ratio of the gas having silicon atoms to the hydrogen peroxide adjusted to be a range of from 1:2 to 1:4.

The molar ratio of the gas having silicon atoms to the hydrogen peroxide is adjusted from 1:2 to 1:4, so that following reaction occurs in preference to other reactions.

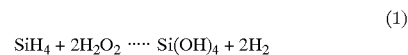

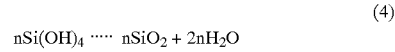

First, $SiH_4$ is oxidized by $H_2O_2$ to form silanol ($Si(OH)_4$). The silanol thus formed causes dehydration polymerization by hydrolysis or thermal energy to generate silicon oxide ($SiO_2$). Such a reaction occurs on the substrate, and silicon oxide film is formed (interlayer insulating film).

To adjust the molar ratio of $SiH_4$ to $H_2O_2$ from 2 to 4, the reactions (1), (2), (3), and (4) as indicated above occur in preference to other reactions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The procedure of performing this invention will now be described below with reference to the accompanying drawings.

Figure 1A:
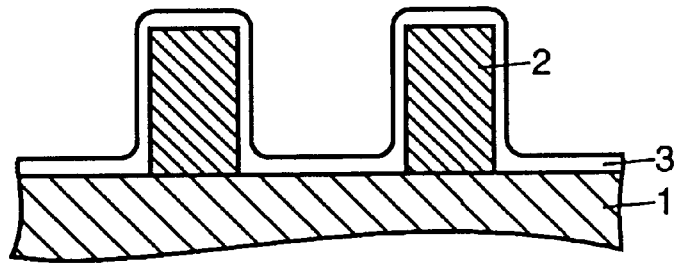
FIGS. 1A to 1C are partial cross-sectional views of a semiconductor device showing respective process steps in order in forming an interlayer insulating film in accordance with an embodiment of the invention.
Figure 1B:
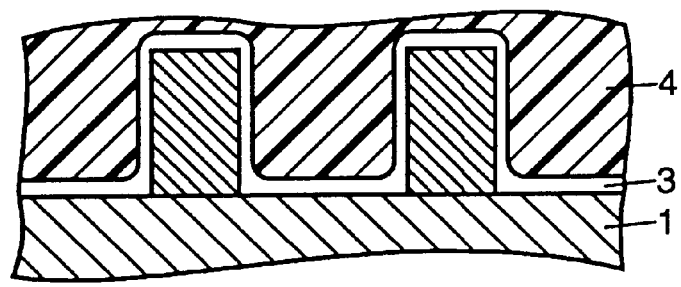
Figure 1C:
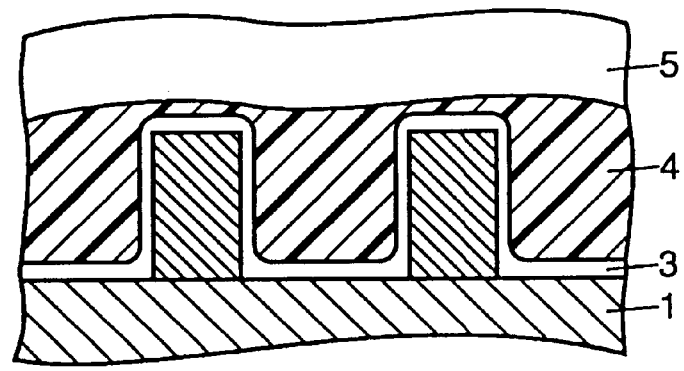

FIGS. 1A to 1C are cross-sectional views of a semiconductor device showing respective process steps in order in forming an interlayer insulating film in accordance with an embodiment of the present invention.

Referring to FIG. 1A, a substrate 1 is prepared which has an aluminum interconnection 2 formed thereon. A first plasma oxide film 3 is deposited on the substrate 1 to cover the surface of the aluminum interconnection 2. The first plasma oxide film 3 is formed by plasma CVD. The conditions of forming the first plasma oxide film are set as follows. That is, temperature is 300° C., pressure is 100.0 Pa, high frequency power is 500 W, and silane ($SiH_4$) and dinitrogen monoxide ($N_2O$) are used as material gas. The film thickness of the first plasma oxide film 3 is 1000 Å. The first plasma oxide film 3 may be formed by plasma CVD (temperature 400° C., pressure 666.5 Pa, high frequency power 500 W) using TEOS (tetraethoxysilane) and oxygen as material gas.

Referring to FIG. 1B, a silicon oxide film 4 (hereinafter referred to as HSO film) is deposited on the first plasma oxide film 3 by CVD using silane ($SiH_4$) and hydrogen peroxide ($H_2O_2$). The conditions of forming HSO film will be described later.

Referring to FIG. 1C, a second plasma oxide film 5 is deposited on the HSO film 4. The conditions of forming the second plasma oxide 5 may be or may not be the same as those of the first plasma oxide film 3.

Next, a second aluminum interconnection (not shown) is formed on the second plasma oxide film 5.

Figure 2:
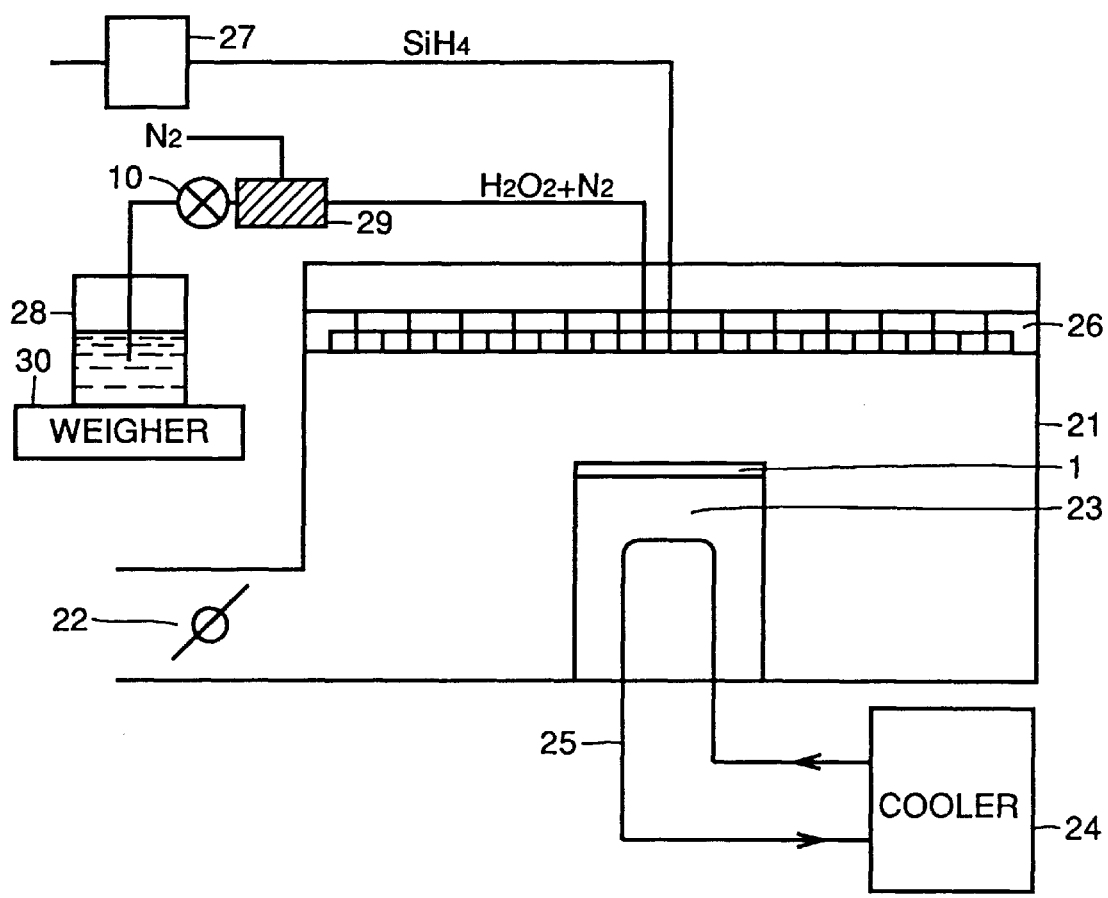
FIG. 2 is a conceptual view showing CVD device utilized in this invention.

FIG. 2 is a conceptual view of a CVD device for forming an HSO film. The CVD device is provided with a reaction chamber 21. The reaction chamber 21 has an exhaust vent 22. A supporting mount 23 which supports the substrate 1 is provided within the reaction chamber 21. A tube pipeline 25 is attached to the supporting mount 23 to pass coolant sent from a cooler 24. At the upper portion of the reaction chamber 21, a gas injector board 26 is provided. The gas injector board 26 has a number of injector vents, some of which are for sending silane gas into the reaction chamber 21, others are for sending hydrogen peroxide and nitrogen (carrier) into the reaction chamber 21. Silane gas is sent to the gas injector board 26 through a massflow controller 27. Hydrogen peroxide is stored in a hydrogen peroxide tank 28, then sent to the injector board 26 with carrier gas $N_2$ through a vaporizer 29. The hydrogen peroxide tank 28 is provided with a weigher 30, so that the amount of hydrogen peroxide which is sent to the reaction chamber 21 is measured.

The most important parameter for forming an uniform HSO film (to make the film thickness uniform across a wafer) is found to be the molar ratio of $H_2O_2$ to silane which is supplied into the reaction chamber.

[Embodiment]

Figure 3:
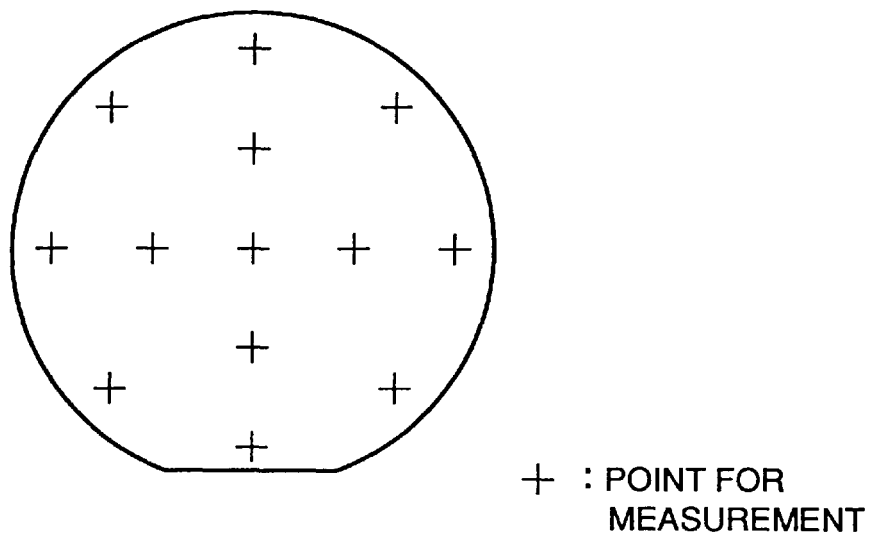
FIG. 3 illustrates a method of measuring the uniformity of film thickness across a wafer.

Referring to FIG. 3, the thickness of the HSO film was defined by setting 13 points for measurement on a wafer, measuring the thickness at those points. The uniformity of film thickness across a wafer which serves by a measure of the film thickness in forming a film is defined as the following formula.

$$\text{unifomity of film thickness (\%)} = \frac{\text{maximum of 13 measured points values} - \text{minimum of 13 measured points values} \times 100}{\text{average of 13 measured points values} \times 2}$$

Figure 4:
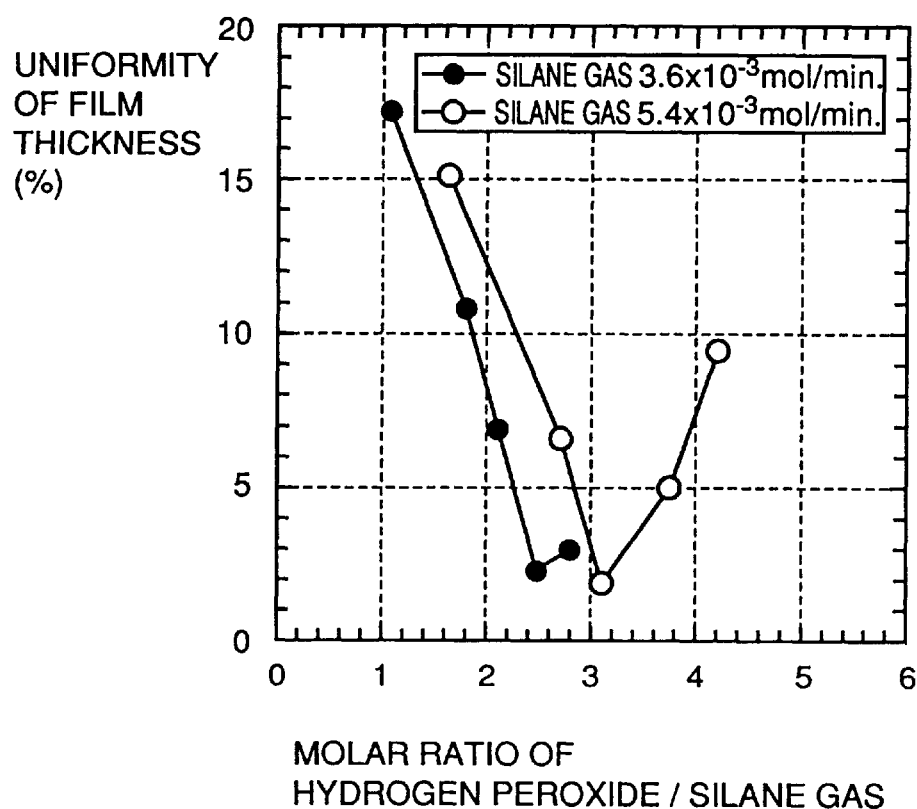
FIG. 4 shows the relationship between the uniformity of film thickness (%) and the molar ratio of hydrogen peroxide to silane gas.
Figure 5A:
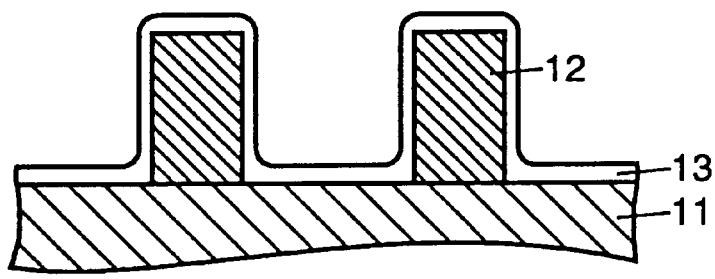
FIGS. 5A to 5C are cross sectional views of a semiconductor device showing respective process steps in order in forming an interlayer insulating film in accordance with a conventional method.
Figure 5B:
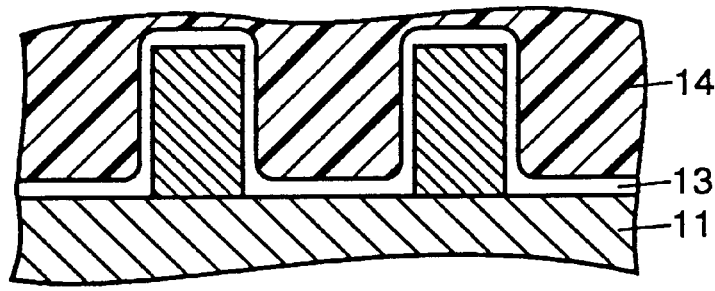
Figure 5C:
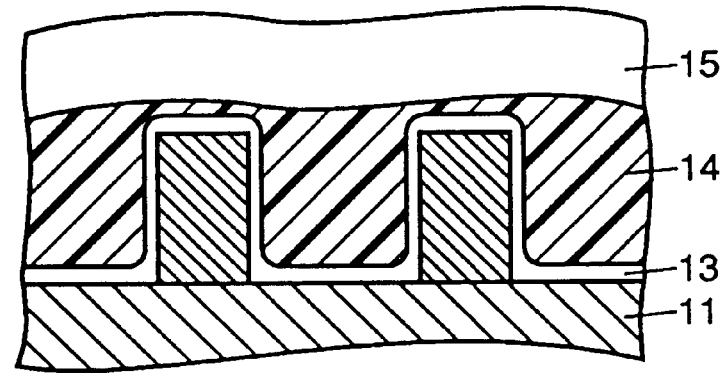

The relationship between the uniformity of film thickness thus determined and the molar ratio of hydrogen peroxide to silane gas which has been obtained through this embodiment is shown in FIG. 4.

Referring to FIG. 4, two experiments were carried out, for one experiment the supply amount of silane gas was $3.6 \times 10^{-3}$ mole/min (●), for the other the supply amount of silane gas was $5.4 \times 10^{-3}$ mole/min (○). Temperature was set to be 1° C. The pressure in the reaction chamber was set to be 66.65 Pa. As apparent from FIG. 4, it was found that the uniformity of film thickness (%) was minimum when the molar ratio of $H_2O_2$ to $SiH_4$ was in the range of from 2 to 4, and the optimum molar ratio of the supplied gas was in the range of from 2 to 4. This result indicates the reaction shown as below occurs preferentially.

(1)
$$SiH_4 + 2H_2O_2 \cdots Si(OH)_4 + 2H_2$$

(2)
$$SiH_4 + 3H_2O_2 \cdots Si(OH)_4 + 2H_2O + H_2$$

(3)
$$SiH_4 + 4H_2O_2 \cdots Si(OH)_4 + 4H_2O$$

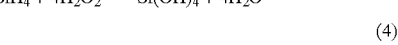
(4)
$$nSi(OH)_4 \cdots nSiO_2 + 2nH_2O$$

It is noted that though two examples of the supply amount of $SiH_4$ were indicated in the above embodiment, that is, one was $3.6 \times 10^{-3}$ mole/min, the other was $5.4 \times 10^{-3}$ mole/min, the invention is not limited to those two cases but a preferable result can be obtained by setting the supply amount of $SiH_4$ to be in the range of $1.8 \times 10^{-3}$ mole/min to $5.4 \times 10^{-3}$ mole/min.

Though the embodiment shown above was performed to form a HSO film at 1° C. as an example, the invention is not limited to only this condition but a preferable result can be obtained by maintaining the temperature of the substrate in the range of from −10° C. to +30° C.

Further, though the embodiment shown above indicated a case as an example in that an HSO film was formed controlling the pressure in the reaction chamber to be 66.65 Pa, the invention is not limited to this but a preferable result can be achieved when the pressure is set to be more than 26.67 Pa.

It was also appreciated that a film of the best quality can be obtained by setting the molar ratio of silane to hydrogen peroxide to be 1:2.

Further, the rate at which a film is formed becomes highest when the ratio of silane to hydrogen peroxide is 1:4. It was also appreciated that to set the molar ratio of silane to hydrogen peroxide to be 1:3 is most preferable in the actual manufacturing process considering above results. The molar ratio of 1:3 makes the process practical for getting a good film quality and accelerating the rate of forming a film.

It is noted that in above embodiment, the first plasma oxide film 3 was deposited to cover the aluminum interconnection, as an example. However, the first plasma oxide film 3 is not always necessary when an interconnection pattern is not an aluminum interconnection.

In the embodiment described above, $SiH_4$ was used as gas having silicon atoms as an example. The present invention, however, is not limited to this example but a similar effect could be obtained using tetraethoxysilane, tetramethoxysilane, fluorotriethoxysilane, etc.

As described above, in accordance with the present invention, an interlayer insulating film is formed by chemical vapor deposition with the molar ratio of gas having silicon atoms to hydrogen peroxide adjusted to be within the range of from 1:2 to 1:4. As a result, an interlayer insulating film of uniform thickness can be formed on a substrate of large size.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming an interlayer insulating film having uniformity of film thickness across a wafer of about 7% or less which is defined as the formula uniformity of film thickness across a wafer (%)= (maximum of 13 measured points values−minimum of 13 measured points values)×100/(average of 13 measured points values)×2 on a wafer of large size, comprising the steps of:

preparing a wafer of large size having an interconnection pattern formed thereon;

adjusting molar ratio of gas having silicon atoms to hydrogen peroxide to be within a range of from 1:2 to 1:4; and forming a silicon oxide film on said wafer by chemical deposition using mixed gas having said molar ratio of gas having silicon atoms and said hydrogen peroxide to cover said interconnection pattern.

2. The method according to claim 1, wherein said gas having silicon atoms includes $SiH_4$.

3. The method according to claim 2, wherein supply amount of said $SiH_4$ is $1.8 \times 10^{-3}$ mole/min to $5.4 \times 10^{-3}$ mole/min.

4. The method according to claim 1, wherein the step of forming said silicon oxide film is performed with temperature of said semiconductor substrate maintained in a range of from −10° C. to +30° C.

5. The method according to claim 1, wherein the step of forming said silicon oxide film is performed under a pressure of at least 26.67 Pa.

6. The method according to claim 1, wherein molar ratio of said gas having silicon atoms to said hydrogen peroxide is adjusted to be 1:2.

7. The method according to claim 1, wherein molar ratio of said gas having silicon atoms to said hydrogen peroxide is adjusted to be 1:4.

8. The method according to claim 1, wherein molar ratio of said gas having silicon atoms to said hydrogen peroxide is adjusted to be 1:3.

9. The method according to claim 1, further comprising, when said interconnection pattern is an aluminum interconnection, the step of covering outer surface of said interconnection pattern with a plasma silicon oxide film prior to the step of forming said silicon oxide film.

10. The method according to claim 1, wherein said gas having silicon atoms comprises tetraethoxysilane.

11. The method according to claim, 1, wherein said gas having silicon atoms comprises tetramethoxysilane.

12. The method according to claim 1, wherein said gas having silicon atoms comprises fluorotriethoxysilane.

13. The method according to claim 4, wherein said silicon oxide film is formed with temperature of said semiconductor substrate maintained at 1° C.

14. The method according to claim 5, wherein said silicon oxide film is formed with pressure maintained at 66.65 Pa.

15. The method according to claim 1, wherein the mixed gas consists essentially of silane and hydrogen peroxide as initial reactants.

* * * * *